(12) United States Patent
Nagatomo

(10) Patent No.: US 11,830,900 B2
(45) Date of Patent: Nov. 28, 2023

(54) PHOTOELECTRIC CONVERSION DEVICE HAVING AN ATTENUATING MEMBER THAT ATTENUATES A GUIDED LIGHT

(71) Applicant: CANON KABUSHIKI KAISHA, Tokyo (JP)

(72) Inventor: Yasuhiro Nagatomo, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 169 days.

(21) Appl. No.: 17/334,219

(22) Filed: May 28, 2021

(65) Prior Publication Data
US 2021/0384243 A1    Dec. 9, 2021

(30) Foreign Application Priority Data

Jun. 4, 2020   (JP) .................................. 2020-097704

(51) Int. Cl.
H01L 27/146   (2006.01)

(52) U.S. Cl.
CPC .. H01L 27/14623 (2013.01); H01L 27/14621 (2013.01); H01L 27/14627 (2013.01)

(58) Field of Classification Search
CPC ......... H01L 27/14623; H01L 27/14629; H01L 27/1464; H01L 27/14612; H01L 27/14621; H01L 27/14627; H04N 25/13; H04N 25/633
See application file for complete search history.

(56) References Cited

U.S. PATENT DOCUMENTS

| 2012/0012961 | A1  | 1/2012  | Kataoka  |              |
|--------------|-----|---------|----------|--------------|
| 2012/0043636 | A1* | 2/2012  | Nagata   | H01L 27/14632 |
|              |     |         |          | 257/435      |
| 2013/0070131 | A1* | 3/2013  | Ohkubo   | H04N 25/76   |
|              |     |         |          | 348/294      |
| 2015/0048317 | A1  | 2/2015  | Sasaki   |              |
| 2015/0243692 | A1  | 8/2015  | Suzuki   |              |
| 2019/0371862 | A1  | 12/2019 | Muroyama |              |
| 2022/0232183 | A1* | 7/2022  | Katayama | H04N 25/42   |

FOREIGN PATENT DOCUMENTS

| JP | 2003-31785 A | 1/2003 |
| JP | 2012-23137 A | 2/2012 |
| JP | 2015-37121 A | 2/2015 |
| JP | 2018-98438 A | 6/2018 |

\* cited by examiner

Primary Examiner — Nelson Garces
(74) Attorney, Agent, or Firm — VENABLE LLP

(57) ABSTRACT

Provided is a back illuminated photoelectric conversion device including a semiconductor substrate that has a first area that is not light-shielded by a light shielding layer, a second area that is light-shielded by the light shielding layer and in which a second pixel is arranged, and a third area that is arranged between the first area and the second area in a plan view. An attenuating member that attenuates a guided light entering the first area and propagating to the second area with the semiconductor substrate as a waveguide is arranged in the third area.

34 Claims, 12 Drawing Sheets

PHOTOELECTRIC CONVERSION DEVICE HAVING AN ATTENUATING MEMBER THAT ATTENUATES A GUIDED LIGHT

BACKGROUND OF THE INVENTION

Field of the Invention

The present invention relates to a photoelectric conversion device, a photoelectric conversion system and a moving body.

Description of the Related Art

Japanese Patent Application Laid-Open No. 2003-031785 discloses a back illuminated photoelectric conversion device. In the back illuminated photoelectric conversion device, the semiconductor substrate is thinned so that incident light can be taken in from a surface opposite to the surface on which a wiring layer is formed. As a result, the sensitivity of the photoelectric conversion device is improved by factors such as reduction of loss due to reflection of light in the wiring layer.

There is a photoelectric conversion device having an optical black pixel area including pixels light-shielded by a light shielding film. The pixels in the optical black pixel area output a reference signal of a black level. When this configuration is applied to a back illuminated photoelectric conversion device having a thin semiconductor substrate, light incident from an area having no light shielding film may enter the optical black pixel area with the semiconductor substrate as a waveguide. In this case, the error of the reference signal acquired in the optical black pixel area may increase.

SUMMARY OF THE INVENTION

The present invention intends to provide a photoelectric conversion device, a photoelectric conversion system, and a moving body which can acquire a reference signal of a black level with higher accuracy.

According to an aspect of the present invention, there is provided a photoelectric conversion device including a semiconductor substrate that has a first face and a second face, a plurality of pixels that is arranged in a plurality of rows and a plurality of columns on the semiconductor substrate, a light shielding layer that is arranged so as to cover a part of the first face of the semiconductor substrate, and a wiring layer that is arranged on a side of the second face with respect to the semiconductor substrate. The plurality of pixels includes a first pixel that outputs a pixel signal based on an incident light from a side of the first face and a second pixel that outputs a reference signal of a black level. The semiconductor substrate has a first area that is not light-shielded by the light shielding layer, a second area that is light-shielded by the light shielding layer and in which the second pixel is arranged, and a third area that is arranged between the first area and the second area in a plan view. An attenuating member that attenuates a guided light entering the first area and propagating to the second area with the semiconductor substrate as a waveguide is arranged in the third area. The attenuating member is not arranged in the first area.

According to another aspect of the present disclosure, there is provided a photoelectric conversion device including a semiconductor substrate that has a first face and a second face, a plurality of pixels that is arranged in a plurality of rows and a plurality of columns on the semiconductor substrate, a light shielding layer that is arranged so as to cover a part of the first face of the semiconductor substrate, and a wiring layer that is arranged on a side of the second face with respect to the semiconductor substrate. The plurality of pixels includes a first pixel that outputs a pixel signal based on an incident light from a side of the first face and a second pixel that outputs a reference signal of a black level. The semiconductor substrate has a first area that is not light-shielded by the light shielding layer, a second area that is light-shielded by the light shielding layer and in which the second pixel is arranged, and a third area that is arranged between the first area and the second area in a plan view. An attenuating member that attenuates a guided light entering the first area and propagating to the second area with the semiconductor substrate as a waveguide is arranged in the third area. The first area is arranged closer to an outer periphery of the semiconductor substrate than the second area in the plan view.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings. Same components or corresponding components across the drawings are labeled with same references, and the description thereof may be omitted or simplified.

First Embodiment

Figure 1:
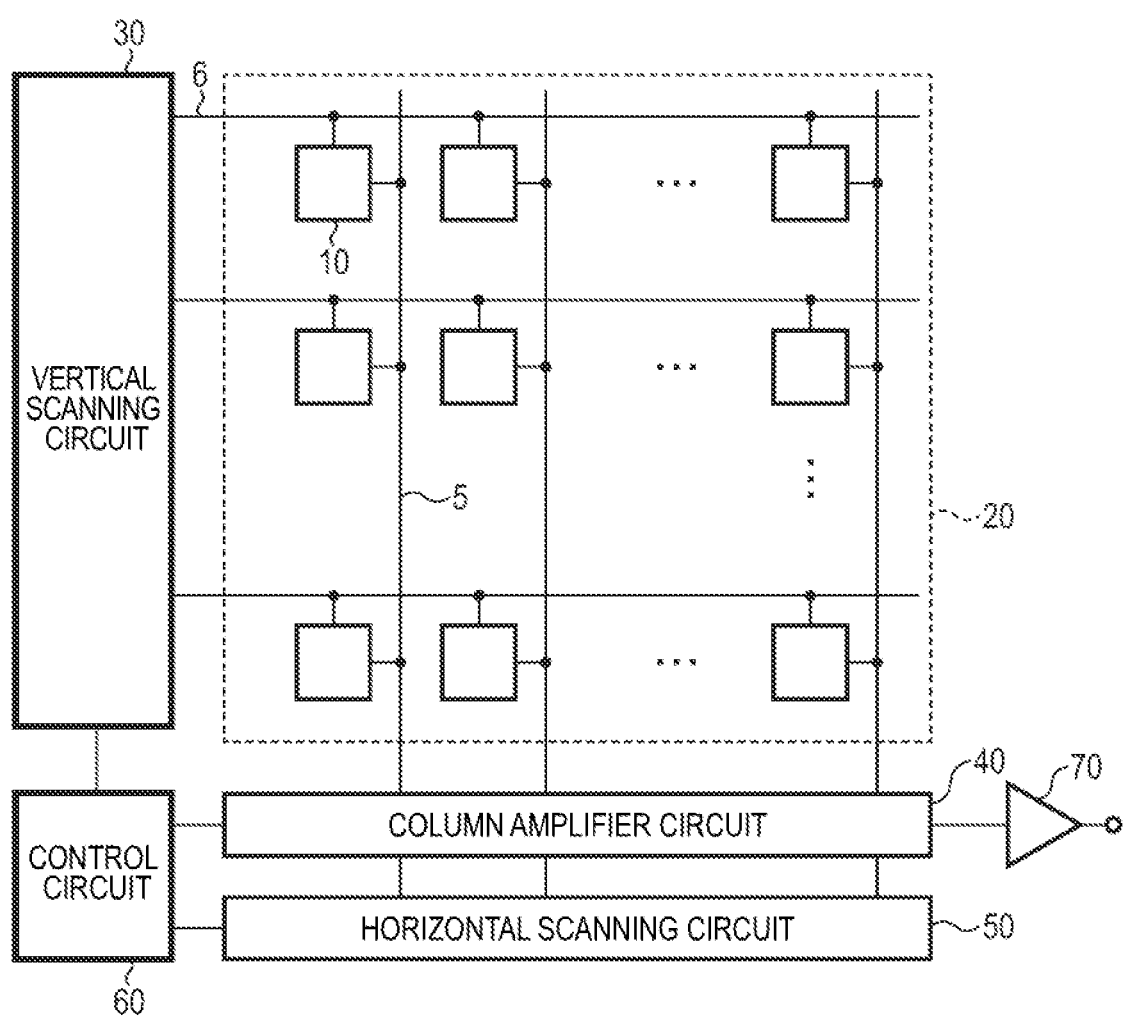
FIG. 1 is a block diagram illustrating a schematic configuration of a photoelectric conversion device according to a first embodiment.

FIG. 1 is a block diagram illustrating a schematic configuration of a photoelectric conversion device according to the present embodiment. The photoelectric conversion device includes a pixel array 20, a vertical scanning circuit 30, a column amplifier circuit 40, a horizontal scanning circuit 50, a control circuit 60, and an output circuit 70. These circuits may be formed on one or more semiconductor substrates. It should be noted that the photoelectric conversion device of the present embodiment is an imaging device for acquiring an image, but the present invention is not limited thereto. For example, the photoelectric conversion device may be a focus detection device, a ranging device, a time of flight (TOF) camera, or the like.

In the present specification, "light" may include electromagnetic waves of any wavelength. That is, the "light" is not limited to visible light, but may include invisible light such as infrared, ultraviolet, and X-ray.

The pixel array 20 includes a plurality of pixels 10 arranged in a plurality of rows and a plurality of columns. The vertical scanning circuit 30 is a scanning circuit that supplies a control signal for controlling a transistor included in the pixel 10 to be on (conductive state) or off (non-conductive state) via a control signal line 6 provided in each row of the pixels 10. The vertical scanning circuit 30 may include a shift register or an address decoder. Since the control signal supplied to each pixel 10 may include a plurality of types of control signals, the control signal line 6 of each row may be configured as a set of a plurality of drive wirings. Each column of the pixels 10 is provided with column signal line 5, and signals from the pixels 10 are read out to the column signal line 5 for each column.

The column amplifier circuit 40 performs processing such as amplification or correlated double sampling processing or the like on the pixel signal output to the column signal line 5. The horizontal scanning circuit 50 supplies a control signal for controlling on or off the switch connected to the amplifier of the column amplifier circuit 40. The horizontal scanning circuit 50 may comprise a shift register or an address decoder. The output circuit 70 includes a buffer amplifier, a differential amplifier, or the like, and outputs a pixel signal from the column amplifier circuit 40 to a signal processing unit outside of the imaging device 1. It should be noted that the imaging device 1 may be configured to output a digital image signal by further including an AD conversion unit. For example, the column amplifier circuit 40 may include an AD conversion unit. The control circuit 60 controls the operation timings of the vertical scanning circuit 30, the column amplifier circuit 40, and the horizontal scanning circuit 50.

Figure 2:
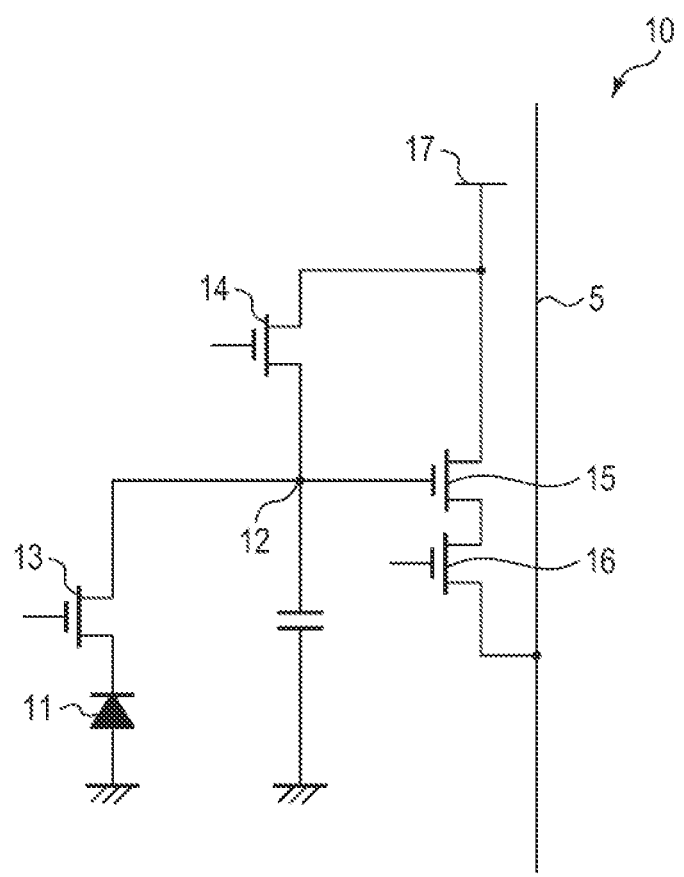
FIG. 2 is a circuit diagram of a pixel according to the first embodiment.

FIG. 2 is a circuit diagram of the pixel 10 according to the present embodiment. The pixel 10 includes a photoelectric conversion unit 11, a floating diffusion (hereinafter, FD) 12, a transfer transistor 13, a reset transistor 14, a source follower transistor (hereinafter, SF transistor) 15, and a selection transistor 16. These transistors may be composed of MOS transistors having a gate electrode as a control electrode. To the gates of the transfer transistor 13, the reset transistor 14 and the selection transistor 16, control signals for controlling these transistors are input from the vertical scanning circuit 30 via the control signal line 6.

The photoelectric conversion unit 11 is a photoelectric conversion element that generates charges according to incident light by photoelectric conversion and accumulates the charges. The photoelectric conversion unit 11 may be constituted by a photodiode formed in a semiconductor substrate. The anode of the photodiode constituting the photoelectric conversion unit 11 is connected to a ground potential line having a ground potential, and the cathode thereof is connected to the source of the transfer transistor 13.

The drain of the transfer transistor 13, the source of the reset transistor 14, and the gate of the SF transistor 15 are connected to the FD 12. When the transfer transistor 13 is turned on, the charges of the photoelectric conversion unit 11 are transferred to the FD 12. The capacitance connected to the FD 12 in FIG. 2 indicates the capacitance generated in the FD 12. With this capacitance, the potential of the FD 12 changes according to the charges transferred from the photoelectric conversion unit 11.

The drain of the reset transistor 14 and the drain of the SF transistor 15 are connected to a potential line 17 having a power source potential. The source of the SF transistor 15 is connected to the drain of the selection transistor 16. The source of the selection transistor 16 is connected to the column signal line 5. The SF transistor 15 constitutes a source follower circuit together with a constant current source (not shown) connected to the column signal line 5. The source follower circuit outputs a signal based on the voltage of the FD 12 to the column signal line 5 via the selection transistor 16. The reset transistor 14 is turned on to reset the potential of the FD 12.

Figure 4:
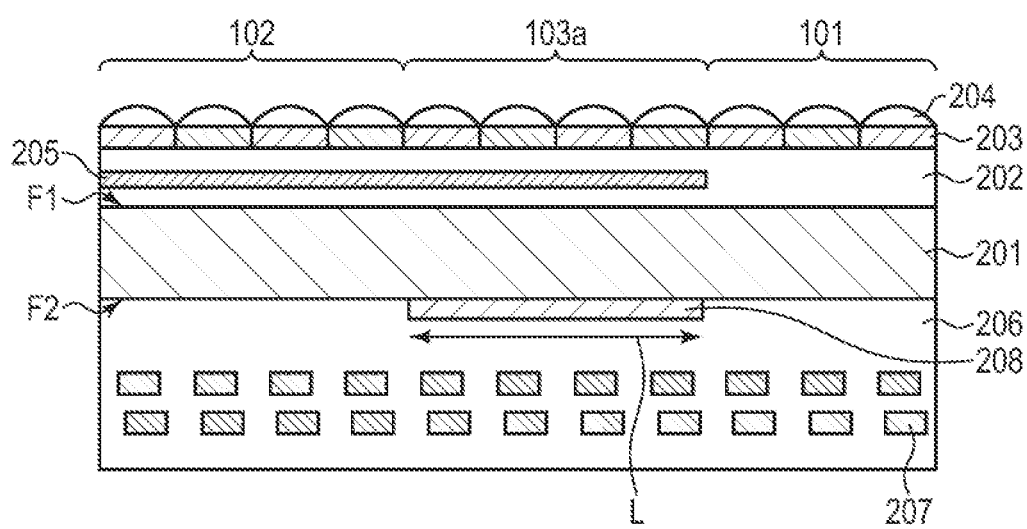
FIG. 4 is a schematic sectional view taken along line A-A' of the photoelectric conversion device according to the first embodiment.

Each of the pixels 10 has a microlens and a color filter arranged on an optical path in which incident light is guided to the photoelectric conversion unit 11 (see FIG. 4 or the like for the arrangement of the microlens and the color filter). The microlens condenses incident light to a photoelectric conversion unit 11. The color filter selectively transmits light of a predetermined color.

Figure 3:
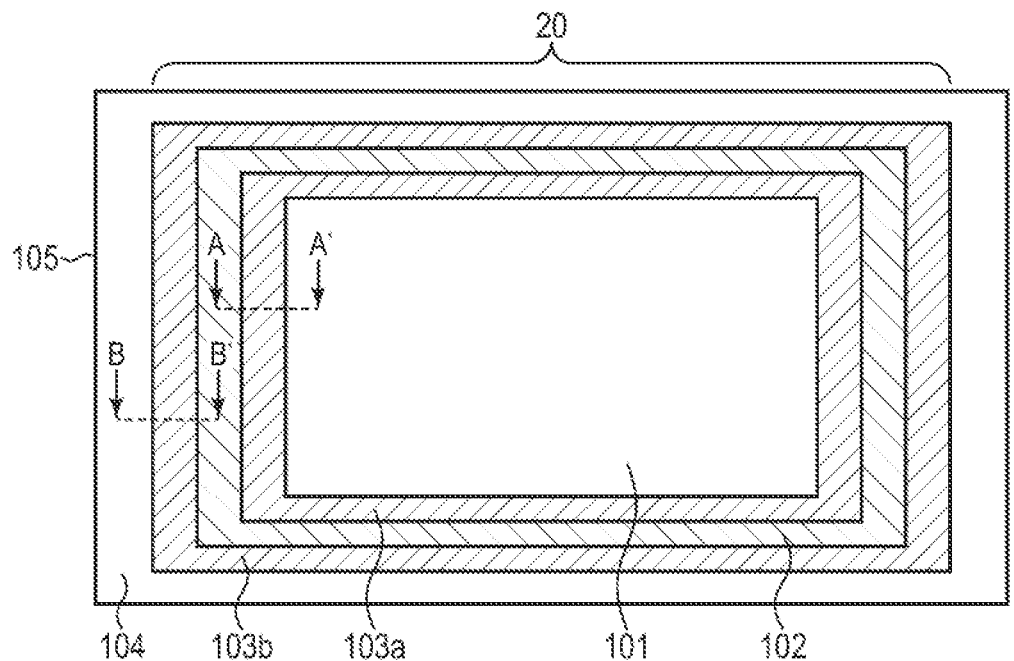
FIG. 3 is a schematic plan view of a semiconductor substrate according to the first embodiment.

FIG. 3 is a schematic plan view of a semiconductor substrate according to the present embodiment. In the pixel array 20, an effective pixel area 101, an optical black pixel area 102, and dummy pixel areas 103a and 103b are arranged. The effective pixel area 101 (first area) is an area in which effective pixels (first pixel) that are pixels 10 outputting pixel signals based on incident light are arranged. The optical black pixel area 102 (second area) is an area in which optical black pixels (second pixel), which are pixels 10 outputting a reference signal of a black level, are arranged, the photoelectric conversion unit 11 of the optical black pixels being shielded from light by the light shielding layer. The dummy pixel areas 103a and 103b (third area) are areas in which dummy pixels (third pixel) outputting neither the pixel signal nor the reference signal are arranged.

The effective pixel area 101 is arranged near the center of the semiconductor substrate on which the pixel array 20 is arranged. The dummy pixel area 103a is arranged to surround the effective pixel area 101. The optical black pixel area 102 is arranged to surround the dummy pixel area 103a. The dummy pixel area 103b is arranged to surround the optical black pixel area 102. An outer peripheral area 104 (first area) is arranged in an area between the dummy pixel area 103b and an outer chip end 105. That is, the outer peripheral area 104 is arranged closer to the outer peripheral side of the semiconductor substrate than the optical black pixel area 102. The outer peripheral area 104 is provided with, for example, a pad for conducting the semiconductor substrate to the outside and an opening in which a light shielding layer is opened to form a pad.

Thus, in a plan view, a dummy pixel area 103a is arranged between the optical black pixel area 102 and the effective pixel area 101. In a plan view, a dummy pixel area 103b is arranged between the optical black pixel area 102 and the outer peripheral area 104. The arrangement of the dummy pixel areas 103a and 103b makes it difficult for light incident on the effective pixel area 101 or the outer peripheral area 104 to enter the optical black pixel area 102.

FIG. 4 is a schematic sectional view taken along line A-A' of the photoelectric conversion device according to the present embodiment. The photoelectric conversion device includes a semiconductor substrate 201, insulating layers 202 and 206, a color filter 203, a microlens 204, a light shielding layer 205, a wiring layer 207 and a light absorbing member 208.

The semiconductor substrate 201 has a first face F1 and a second face F2. The first face F1 is sometimes referred to as the back, and the second face F2 is sometimes referred to as the front. The primary material of the semiconductor substrate 201 is typically silicon. The semiconductor substrate 201 may contain silicon as a primary material, or may contain a material other than silicon. The photoelectric conversion unit 11 and various transistors illustrated in FIG. 2 are formed in a semiconductor region in the semiconductor substrate 201. The thickness of the semiconductor substrate 201 is typically about 3 μm.

The insulating layer 202 is arranged on the first face F1 of the semiconductor substrate 201. The material of the insulating layer 202 is typically silicon oxide. On the surface of the insulating layer 202 opposite to the semiconductor substrate 201, a color filter 203 and a microlens 204 are arranged in order. One color filter 203 and one microlens 204 are arranged corresponding to one of the plurality of pixels 10. Light incident from the first face F1 side of the semiconductor substrate 201 passes through the microlens 204, the color filter 203 and the insulating layer 202 and is incident on the first face F1 of the semiconductor substrate 201. As described above, the photoelectric conversion device of the present embodiment has a structure for detecting light incident from the back of the semiconductor substrate 201, and is therefore called a back illuminated type.

In the optical black pixel area 102 and the dummy pixel area 103a, a light-shielding layer 205 is arranged on the first face F1 through an insulating layer 202. The material of the light shielding layer 205 is typically aluminum, and the thickness of the light shielding layer 205 is typically about 200 nm.

Light incident on the microlens 204 in the optical black pixel area 102 and the dummy pixel area 103a is not incident on the semiconductor substrate 201 because the light shielding layer 205 shields the light. Thus, the pixel 10 in the optical black pixel area 102 can output a reference signal of a black level.

In contrast, since the light shielding layer 205 is not provided in the effective pixel area 101, the light incident on the microlens 204 in the effective pixel area 101 is incident on the semiconductor substrate 201. Thus, the pixel 10 in the effective pixel area 101 can output a pixel signal based on the incident light.

The insulating layer 206 is arranged on the second face F2 of the semiconductor substrate 201. The material of the insulating layer 206 is typically silicon oxide. A wiring layer 207 is arranged on the second face F2 of the semiconductor substrate 201 through an insulating layer 206. In the back illuminated photoelectric conversion device, light is incident from a face (back) on the side opposite to the face (front) on which the wiring layer 207 is arranged, so that loss due to reflection of incident light by the wiring layer 207 is suppressed.

The light absorbing member 208 is arranged on the second face F2 in the dummy pixel area 103a over a length L. The direction defining the length L is a direction parallel to the first face F1 or the second face F2. The material of the light absorbing member 208 may be any material that absorbs light propagating through the semiconductor substrate 201, and is typically a metal such as aluminum or tungsten. When aluminum or tungsten is used as the material of the light absorbing member 208, other metals may be further included. The thickness of the light absorbing member 208 is typically about 150 nm. The effect of providing the light absorbing member 208 will be described later.

Figure 5:
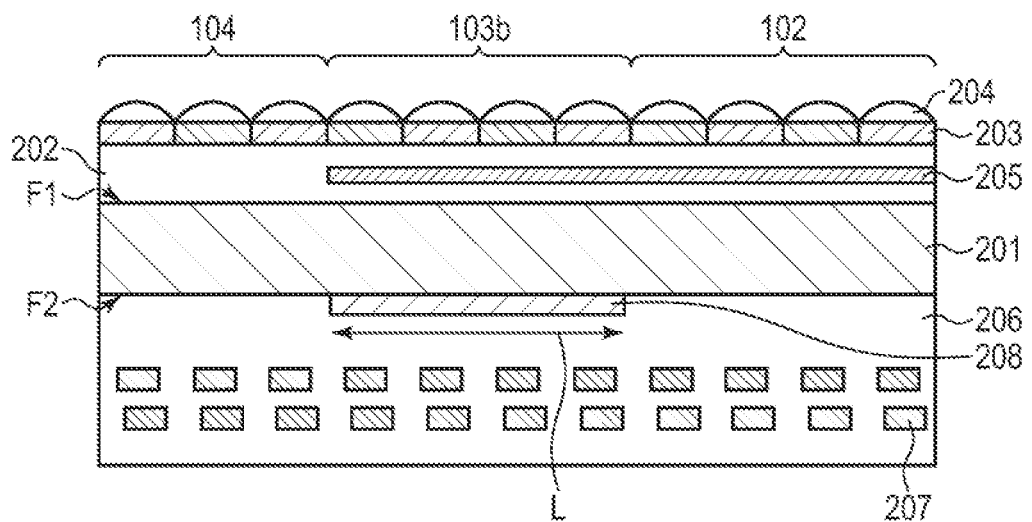
FIG. 5 is a schematic sectional view taken along line B-B' of the photoelectric conversion device according to the first embodiment.

FIG. 5 is a schematic sectional view taken along line B-B' of the photoelectric conversion device according to the present embodiment. As in the dummy pixel area 103a, in the dummy pixel area 103b, a light shielding layer 205 is arranged on the first face F1 through an insulating layer 202. As in the dummy pixel area 103a, in the dummy pixel area 103b, the light absorbing member 208 is arranged on the second face F2.

As in the effective pixel area 101, since the light shielding layer 205 is not arranged in the outer peripheral area 104, the light incident on the microlens 204 in the outer peripheral area 104 is incident on the semiconductor substrate 201. Since the outer peripheral area 104 is an area where pads for conducting the semiconductor substrate 201 to the outside are formed, the light shielding layer 205 is opened at least in a part of the outer peripheral area 104 as illustrated in FIG. 5. Since the effective pixel area 101 and the outer peripheral area 104 are areas in which incident light is not light-shielded by the light shielding layer 205, they are sometimes collectively referred to as non-light-shielded areas (first area).

Figure 6:
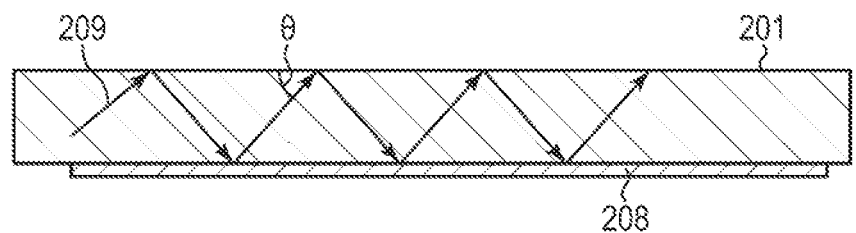
FIG. 6 is a schematic sectional view illustrating the guided light in the semiconductor substrate according to the first embodiment.

Next, the effect of providing the light absorbing member 208 in the dummy pixel areas 103a and 103b will be described. Light incident from the non-light-shielded area may be propagated to the optical black pixel area 102 with the semiconductor substrate 201 as a waveguide. FIG. 6 is a schematic sectional view illustrating the guided light in the semiconductor substrate according to the present embodiment. When the propagation angle θ satisfies the total reflection condition, the guided light 209 is confined in the semiconductor substrate 201 and guided in the in-plane direction by repeating the total reflection inside the semiconductor substrate 201. Although the guided light is gradually absorbed and attenuated by the semiconductor substrate 201 in the process of propagating inside the semiconductor substrate 201, the light remaining without being absorbed may enter the optical black pixel area 102. In this case, the level of the reference signal of the black level fluctuates, and the accuracy may be deteriorated. In particular, in the case of the back illuminated type, since the semiconductor substrate 201 is thin, a waveguide is likely to occur inside the semiconductor substrate 201, and the deterioration of accuracy due to this factor may be remarkable.

When the material of the semiconductor substrate 201 is silicon, the degree of attenuation of light due to absorption of light by the silicon depends on the wavelength of the light. For example, the absorption coefficient of silicon for visible light at a wavelength of 550 nm is about 7000 cm$^{-1}$, and the light intensity attenuates to about half when it propagates 1 μm through silicon. In contrast, the absorption coefficient for near-infrared light having a wavelength of 1000 nm is about 100 cm$^{-1}$, and the absorption rate when propagating through silicon at 1 μm is about 0.5%. In order to attenuate the light intensity of the near-infrared light having a wavelength of 1000 nm to half, a propagation distance of 70 which is about 70 times a propagation distance of light at the wavelength of 550 nm, is required. For the reasons described above, in general, near-infrared light has a higher rate of reaching the optical black pixel area 102 without attenuated in silicon than visible light, which tends to cause a deterioration of accuracy.

In order to reduce the light reaching the optical black pixel area 102, the distance between the non-light-shielded area and the optical black pixel area 102, that is, the length of the dummy pixel areas 103a and 103b, may be increased. However, increasing the length of the dummy pixel areas 103a and 103b may be undesirable because it increases the chip size or decreases the number of effective pixels. In particular, since a long distance is required to attenuate the near-infrared light as described above, the arrangement of the dummy pixel areas 103a and 103b may not be sufficient to sufficiently reduce the light reaching the optical black pixel area 102.

Therefore, in the present embodiment, the light absorbing member 208 is arranged in the dummy pixel areas 103a and 103b. As a result, when the guided light is propagated with the semiconductor substrate 201 as the waveguide, the ratio of attenuation in the dummy pixel areas 103a and 103b can be increased, and the intensity of the guided light incident on the optical black pixel area 102 can be reduced. Therefore, according to the present embodiment, there is provided a photoelectric conversion device capable of acquiring a reference signal of a black level with higher accuracy.

In order to make the attenuation of the guided light more effective, the material of the light absorbing member 208 is preferably a material having a larger absorption coefficient than the material of the semiconductor substrate 201. At a wavelength of 1000 nm, the absorption coefficient of silicon is about 100 cm$^{-1}$ while that of aluminum is about $1.2 \times 10^6$ cm$^{-1}$ and that of tungsten is about $4.3 \times 10^5$ cm$^{-1}$. Thus, metals such as aluminum and tungsten have much greater absorption coefficients than silicon. Therefore, when the semiconductor substrate 201 is made of silicon, the above-described conditions are satisfied if the material of the light absorbing member 208 is a metal such as aluminum or tungsten or the like.

The light absorbing member 208 is preferably provided in the dummy pixel areas 103a and 103b as widely as possible from the viewpoint of sufficiently securing the attenuation amount. More specifically, since the dummy pixel areas 103a and 103b are longer than at least one pixel, the length L of the light absorbing member 208 is preferably longer than one pixel.

The light absorbing member 208 is not arranged in the effective pixel area 101 and the optical black pixel area 102. This is because, in the effective pixel area 101 and the optical black pixel area 102, circuits constituting the pixel 10 or the like are arranged. The light absorbing member 208 may or may not be arranged in the outer peripheral area 104.

Next, preferable forms of the material, arrangement, or the like of the light absorbing member 208 will be described while showing simulation results as appropriate. In the following simulation, it is assumed that the material of the semiconductor substrate 201 is silicon. Light guided through silicon has a plurality of guided modes that propagate at different propagation angles. Further, the TE mode and the TM mode exist due to the difference in the polarization direction. The propagation loss of guided modes is different depending on these modes. Here, as a typical mode among them, a calculation result of the TE mode and a mode with a propagation angle of about 45° is shown. The propagation angle is defined as an angle formed by the light propagating direction with respect to the horizontal direction (θ in FIG. 6).

As a result of calculating the propagation loss at a wavelength of 1000 nm in this waveguide mode, when the light absorbing member 208 is not provided, that is, when only the absorption of silicon is present, the propagation loss of the waveguide mode is 140 cm$^{-1}$. In contrast, when aluminum was used as the light absorbing member 208, the propagation loss of the guided mode was 360 cm$^{-1}$. When tungsten was used as the light absorbing member 208, the propagation loss of the waveguide mode was 1840 cm$^{-1}$.

Using the above calculation result, the light intensity when light propagates at a specific distance, for example, a distance of 30 μm, is attenuated by 0.66 times when the light absorbing member 208 is not provided. In contrast, when aluminum is used as the light absorbing member 208, the light intensity is attenuated by 0.34 times, and when tungsten is used as the light absorbing member 208, the light intensity is attenuated by 0.004 times. Thus, compared with the case where the light absorbing member 208 is not provided, the light intensity can be reduced to about half when aluminum is used as the light absorbing member 208, and the light intensity can be reduced to about 1/165 when tungsten is used as the light absorbing member 208.

As described above, aluminum has a larger absorption coefficient than tungsten. Nevertheless, the reason why the propagation loss is larger when tungsten is used than when aluminum is used as the light absorbing member 208 will be described with reference to FIG. 7A and FIG. 7B.

Figure 7A:
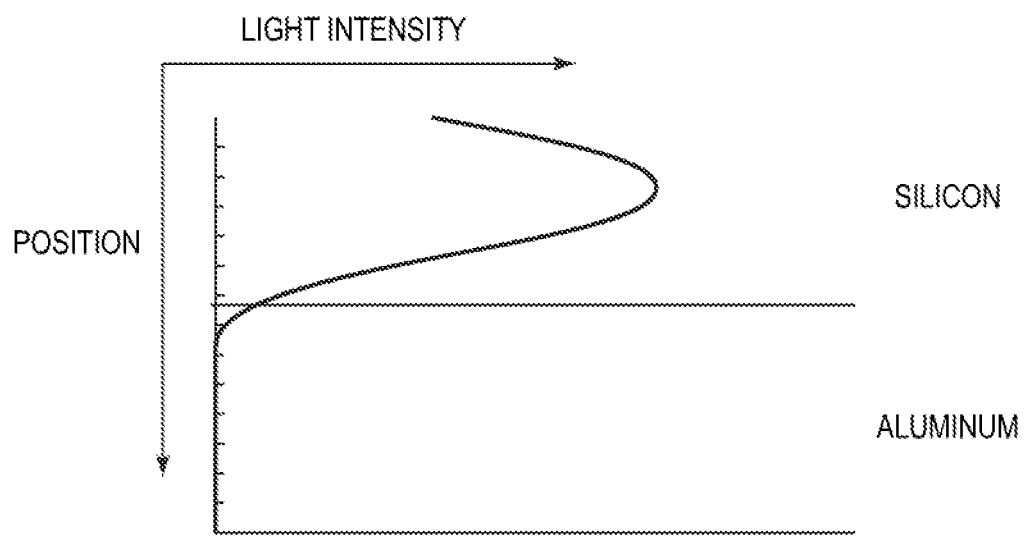
FIG. 7A and FIG. 7B are schematic diagrams illustrating the amount of light entering the light absorbing member according to the first embodiment.
Figure 7B:
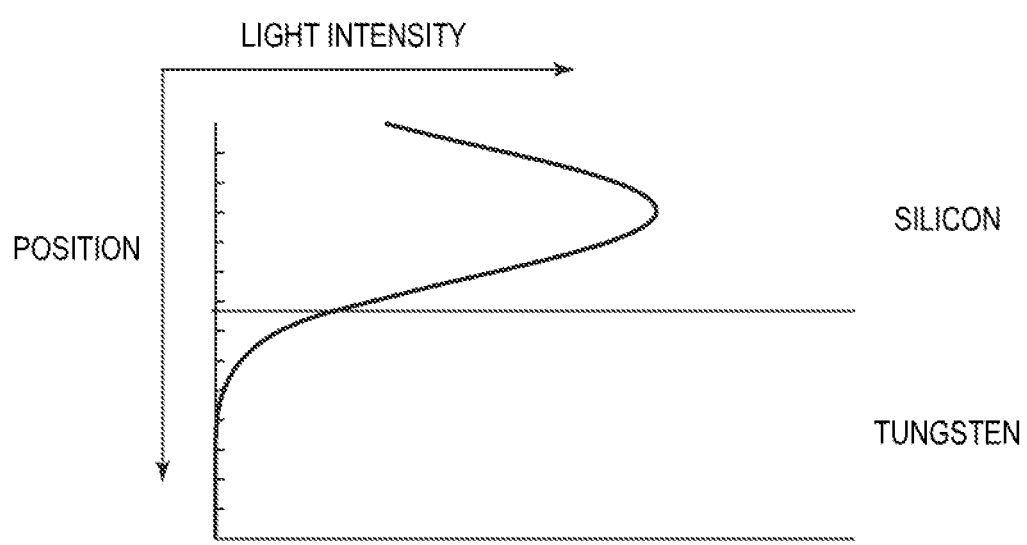

FIG. 7A and FIG. 7B are schematic diagrams illustrating the amount of light entering the light absorbing member 208 according to the present embodiment. FIG. 7A and FIG. 7B show the calculation results of the light intensity distribution near the interface between the semiconductor substrate 201 (silicon) and the light absorbing member 208 (aluminum or tungsten) in the waveguide mode at a wavelength of 1000 nm. In FIG. 7A and FIG. 7B, the vertical axis indicates the position in the thickness direction, and the horizontal axis indicates the light intensity of the waveguide mode. The curves of FIG. 7A and FIG. 7B show the distribution of light intensity. In this curve, it can be said that the larger the area defined by the curve in each layer is, the more guided light propagates in the layer.

FIG. 7A shows a light intensity distribution when aluminum is provided as the light absorbing member 208, and FIG. 7B shows a light intensity distribution when tungsten is provided as the light absorbing member 208. In either distribution, the light exuding from the semiconductor substrate 201 to the light absorbing member 208 (evanescent wave) is exponentially attenuated. However, comparing FIG. 7A and FIG. 7B, it can be seen that the amount of light entering the light absorbing member 208 is less when the light absorbing member 208 is made of aluminum than when the light absorbing member 208 is made of tungsten.

The reason for the difference in the amount of entering light is that the refractive index of aluminum (n=1.35) is smaller than that of tungsten (n=3.04). The larger the difference between the refractive index of the semiconductor substrate 201 and that of the silicon constituting the semiconductor substrate (n=3.58), the smaller the amount of light guided through the semiconductor substrate 201 exudes out to the light absorbing member 208, and as a result, the smaller the light absorption amount. Therefore, tungsten is more suitable than aluminum as a material of the light absorbing member 208. As described above, in selecting the material of the light absorbing member 208, it is necessary to consider not only the absorption coefficient of the material itself but also the relationship of the refractive index of the semiconductor substrate 201.

Next, the influence of the distance between the semiconductor substrate 201 and the light absorbing member 208 on the propagation loss will be described. The calculation result of the propagation loss described above is obtained when the semiconductor substrate 201 is in contact with the light absorbing member 208. However, even when the semiconductor substrate 201 and the light absorbing member 208 are not in contact with each other, that is, when another layer is sandwiched between them, there is an effect of increasing the propagation loss. However, it is necessary to arrange the light absorbing member 208 in a range where evanescent waves exuding from the semiconductor substrate 201 sufficiently exist. In order to obtain a sufficient propagation loss, it is desirable to arrange the light absorbing member 208 at a position close to the semiconductor substrate 201.

Figure 8:
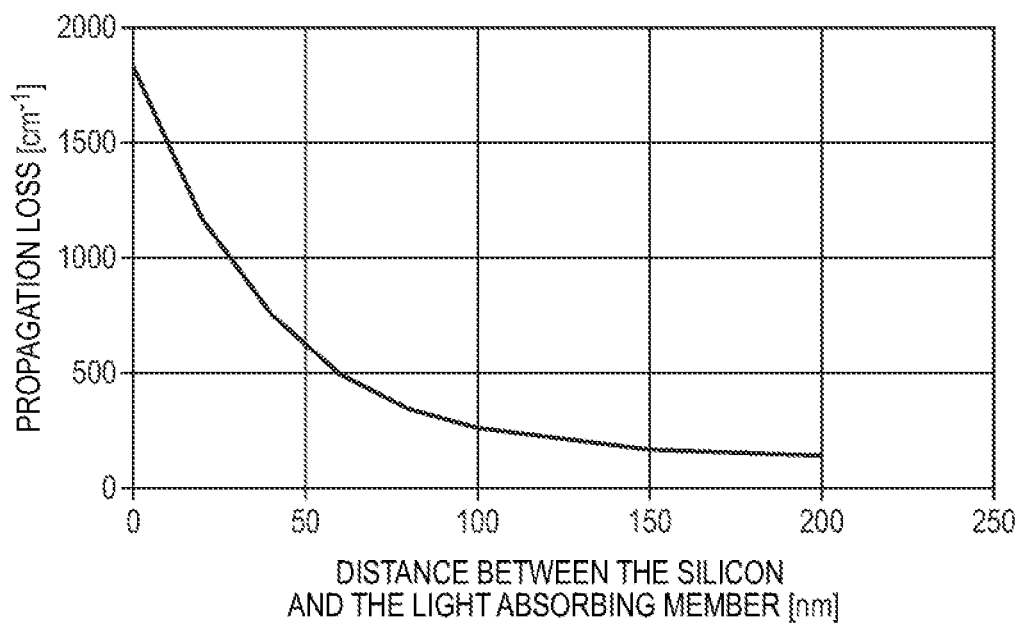
FIG. 8 is a graph showing the influence of the distance between the semiconductor substrate and the light absorbing member according to the first embodiment.

FIG. 8 is a graph showing the influence of the distance between the semiconductor substrate 201 and the light absorbing member 208. The horizontal axis of FIG. 8 shows the distance between the semiconductor substrate 201 (silicon) and the light absorbing member 208 (tungsten). Here, silicon oxide is arranged between the semiconductor substrate 201 and the light absorbing member 208. That is, the horizontal axis of FIG. 8 is the thickness of silicon oxide. The vertical axis of FIG. 8 shows the propagation loss. As shown in FIG. 8, as the distance between the semiconductor substrate 201 and the light absorbing member 208 increases, the propagation loss decreases and approaches the propagation loss in the case where the light absorbing member 208 is not provided (140 cm$^{-1}$).

It is desirable that the distance between the semiconductor substrate 201 and the light absorbing member 208 be 100 nm or less, and in this case, the propagation loss can be increased by two times as compared with the case where the light absorbing member 208 is not provided.

It is more desirable that the distance between the semiconductor substrate 201 and the light absorbing member 208 be 80 nm or less, and in this case, the propagation loss can be increased by 2.5 times as compared with the case where the light absorbing member 208 is not provided.

It is more desirable that the distance between the semiconductor substrate 201 and the light absorbing member 208 be 70 nm or less, and in this case, the propagation loss can be increased by three times as compared with the case where the light absorbing member 208 is not provided.

It is more desirable that the distance between the semiconductor substrate 201 and the light absorbing member 208 be 50 nm or less, and in this case, the propagation loss can be increased by four times as compared with the case where the light absorbing member 208 is not provided.

It is more desirable that the distance between the semiconductor substrate 201 and the light absorbing member 208 be 40 nm or less, and in this case, the propagation loss can be increased by five times as compared with the case where the light absorbing member 208 is not provided.

It is more desirable that the distance between the semiconductor substrate 201 and the light absorbing member 208 be 20 nm or less, and in this case, the propagation loss can be increased by eight times as compared with the case where the light absorbing member 208 is not provided.

It is more desirable that the distance between the semiconductor substrate 201 and the light absorbing member 208 be 10 nm or less, and in this case, the propagation loss can be increased by ten times as compared with the case where the light absorbing member 208 is not provided.

It is more desirable that the distance between the semiconductor substrate 201 and the light absorbing member 208 be zero, that is, the semiconductor substrate 201 and the light absorbing member 208 be in contact with each other, and in this case, the propagation loss can be maximized.

In this way, it is desirable that the light absorbing member 208 be arranged as close to the semiconductor substrate 201 as possible. In general, even a layer closest to the semiconductor substrate 201 among the wiring layers 207 used for electrical connection or the like is arranged at a position farther than the above-described distance from the semiconductor substrate 201. Therefore, the light absorbing member 208 is not shared with the wiring layer 207, and it is desirable to provide the light absorbing member 208 at a position closer to the semiconductor substrate 201 than the wiring layer 207.

Figure 9:
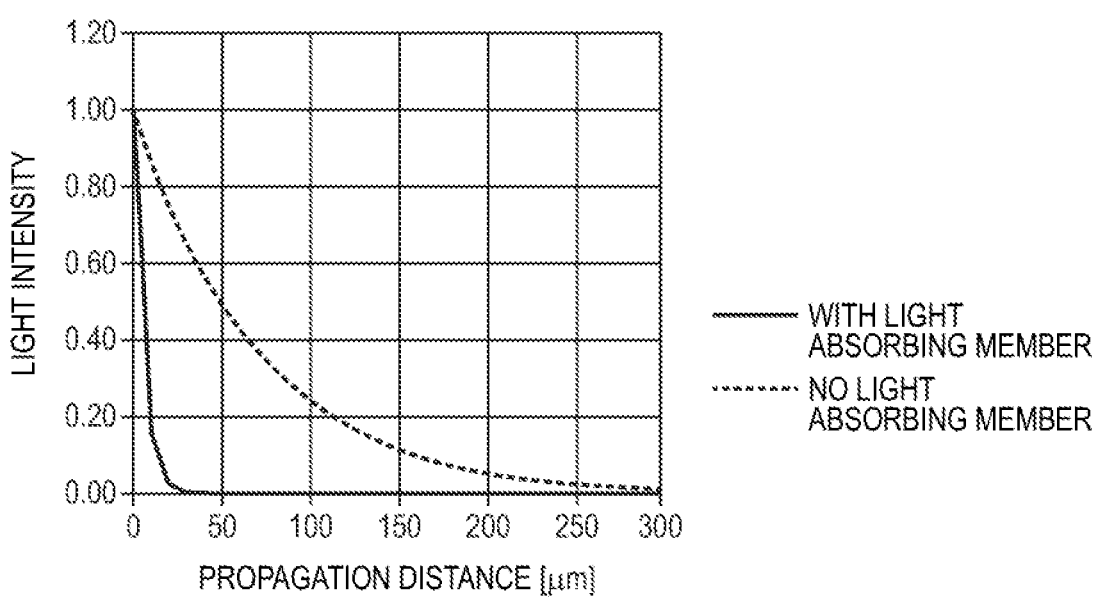
FIG. 9 is a graph showing the relationship between the intensity and the propagation distance of the guided light according to the first embodiment.

The guided light in the semiconductor substrate 201 is exponentially attenuated in accordance with the product of the propagation distance and the propagation loss per unit length. FIG. 9 is a graph showing the relationship between the intensity and the propagation distance of the guided light according to the present embodiment. In the calculation shown in FIG. 9, the light absorbing member 208 (tungsten) is arranged in contact with the second face F2 of the semiconductor substrate 201 (silicon). The thickness of the light absorbing member 208 is 150 nm, and the thickness of the semiconductor substrate 201 is 3 μm. The upper and lower insulating layers 202 and 206 of the semiconductor substrate 201 are made of silicon oxide. In the graph of FIG. 9, the vertical axis indicates the intensity of the guided light with respect to the light having a wavelength of 1000 nm, and the horizontal axis indicates the propagation distance. In FIG. 9, a graph in a case where the light absorbing member 208 is not arranged is shown by a broken line, and a graph in a case where the light absorbing member 208 is arranged is shown by a solid line. The value of the vertical axis is normalized by the intensity when the propagation distance is zero.

As shown by the broken line in FIG. 9, even when the light absorbing member 208 is not arranged, the light intensity gradually decreases according to the propagation distance due to the absorption of the semiconductor substrate 201 itself. However, even if it propagates to 300 μm, about 1% of the light remains unabsorbed. In contrast, when the light absorbing member 208 is arranged, the light intensity is reduced to 1% or less at a propagation distance of about 30 μm. The propagation distance, that is, the length L where the light absorbing member 208 is provided, is determined according to how much the guided light needs to be attenuated.

The length of the light absorbing member 208 is preferably 15 μm or more, and in this case, the intensity of the waveguide light can be reduced to 1/10.

The length of the light absorbing member 208 is preferably 30 μm or more, and in this case, the intensity of the guided light can be reduced to 1/100.

The length of the light absorbing member 208 is preferably 45 μm or more, and in this case, the intensity of the guided light can be reduced to 1/1000.

The length described above is generally the length of one or more pixels of the photoelectric conversion device. Therefore, it is desirable that the length L of the light absorbing member 208 extend over one pixel or more. Note that a part of the light absorbing member 208 may be broken off, and even in such a case, if the total length satisfies the above-described value, the same effect can be obtained.

The path where incident light enters optical black pixel area 102 is a path from the effective pixel area 101 in FIG. 3 and FIG. 4 or a path from the outside of the optical black pixel area 102, that is, from the outer peripheral area 104 in FIG. 3 and FIG. 5. Therefore, it is desirable that the light absorbing member 208 be arranged in both the dummy pixel area 103a between the effective pixel area 101 and the optical black pixel area 102 and the dummy pixel area 103b between the optical black pixel area 102 and the outer peripheral area 104.

Also, in the structural diagrams illustrated in FIG. 4 and FIG. 5, only the A-A' and B-B' lines of FIG. 3, that is, the transverse section of FIG. 3, are illustrated. However, it is desirable that the longitudinal section of FIG. 3 has a similar structure. That is, it is desirable that the light absorbing member 208 be provided in the same manner as in FIG. 4 and FIG. 5 in the longitudinal section of FIG. 3. In this case, in FIG. 3, the influence of the guided light entering the optical black pixel area 102 in the longitudinal direction can be reduced.

Second Embodiment

The photoelectric conversion device of the present embodiment is a modified example in which the position of the light absorbing member 208 in the first embodiment is changed. The structure of the device other than the difference in the position of the light absorbing member 208 is the same as that of the first embodiment, and a description thereof will be omitted.

Figure 10:
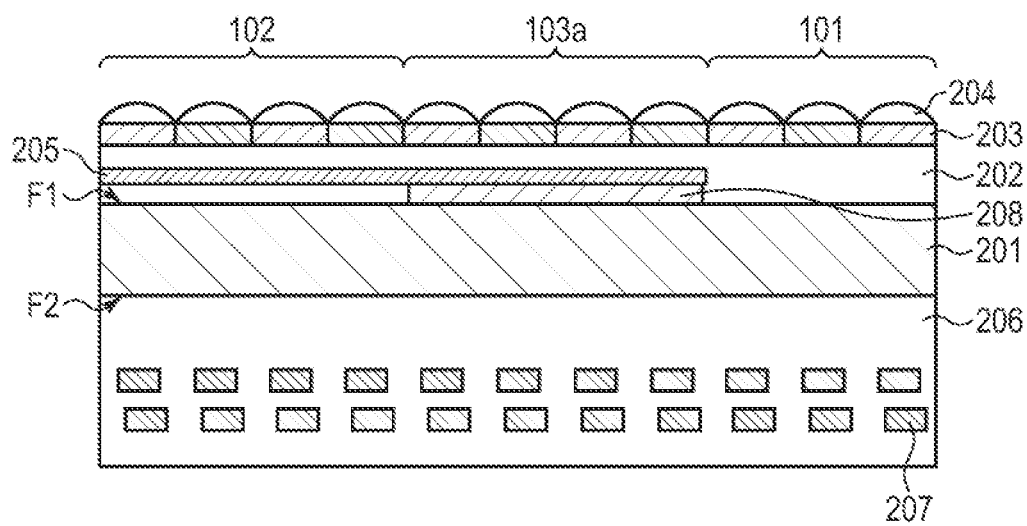
FIG. 10 is a schematic sectional view taken along line A-A' of the photoelectric conversion device according to a second embodiment.

FIG. 10 is a schematic sectional view taken along line A-A' of the photoelectric conversion device according to the present embodiment. In the present embodiment, the light absorbing member 208 is arranged in the dummy pixel area 103a between the first face F1 and the light shielding layer 205. In other words, on the side of the first face F1 of the semiconductor substrate 201, a laminated structure of the light absorbing member 208 and the light shielding layer 205 is provided.

In the configuration of the present embodiment, the guided light using the semiconductor substrate 201 as the waveguide is attenuated by the light absorbing member 208 by the mechanism similar to that of the first embodiment. Therefore, also in the configuration of the present embodiment, a photoelectric conversion device capable of acquiring a reference signal of a black level with higher accuracy is provided as in the first embodiment.

Since different performances are required for the light absorbing member 208 and the light shielding layer 205, they are preferably different materials. More specifically, the material of the light absorbing member 208 is preferably tungsten, and the material of the light shielding layer 205 is preferably aluminum. The reason is explained in detail.

As described in the first embodiment, the absorption coefficient of aluminum is larger than that of tungsten as the absorption coefficient of the material itself. Therefore, aluminum is preferable to tungsten as a material of the light-shielding layer 205 for light-shielding incident light from the incident surface to the optical black pixel area 102. In contrast, the effect of attenuation on the guided light in the semiconductor substrate 201 depends not only on the absorption coefficient but also on the refractive index. Due to this effect, as described in the first embodiment, tungsten is more suitable than aluminum as a material of the light absorbing member 208. By adopting a configuration in which the material of the light absorbing member 208 is tungsten and the material of the light shielding layer 205 is aluminum, both can be achieved.

Although the layer in which the light absorbing member 208 is provided is not limited to the layer illustrated in FIG. 10, it is desirable that the layer be between the first face F1 of the semiconductor substrate 201 and the light shielding layer 205 as illustrated in FIG. 10. Since the effect of light-shielding by the light shielding layer 205 does not depend so much on the distance between the light shielding layer 205 and the semiconductor substrate 201, there may be a certain distance between the light shielding layer 205 and the semiconductor substrate 201. In contrast, as described in the first embodiment, since the influence of the distance between the light absorbing member 208 and the semiconductor substrate 201 on the propagation loss is large, the distance between the light absorbing member 208 and the semiconductor substrate 201 is desirably as close as possible. Therefore, the light absorbing member 208 is preferably arranged between the first face F1 of the semiconductor substrate 201 and the light shielding layer 205. The light shielding layer 205 and the light absorbing member 208 may be in contact with each other, and another layer of silicon oxide or the like may be arranged between them.

Third Embodiment

The photoelectric conversion device of the present embodiment is a modified example in which a diffraction grating 210 is provided in place of the light absorbing member 208 in the first embodiment. Since the structure of the device is the same as that of the first embodiment except that the light absorbing member 208 is replaced by the diffraction grating 210, the description thereof will be omitted.

Figure 11:
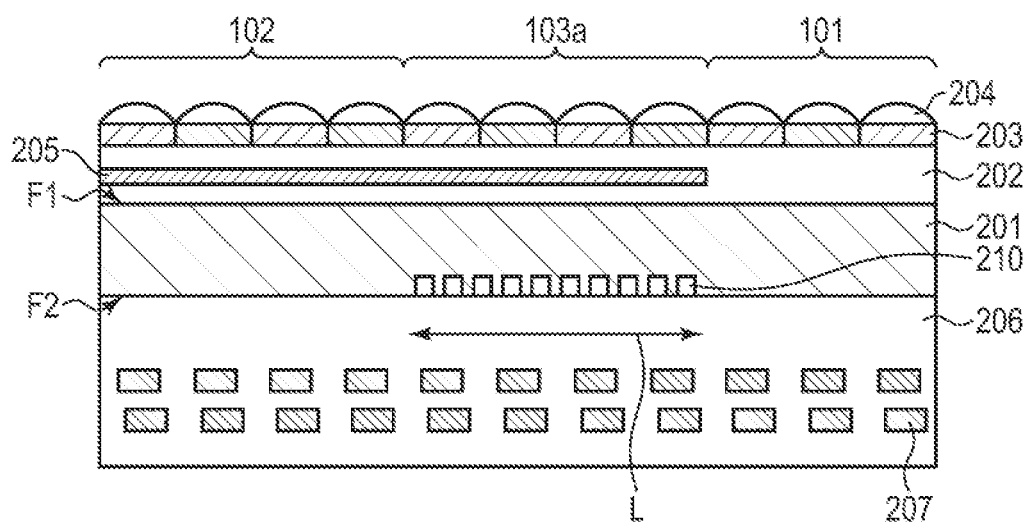
FIG. 11 is a schematic sectional view taken along line A-A' of the photoelectric conversion device according to a third embodiment.

FIG. 11 is a schematic sectional view taken along line A-A' of the photoelectric conversion device according to the present embodiment. In the present embodiment, instead of the light absorbing member 208 of the first embodiment, the diffraction grating 210 is arranged in the vicinity of the second face F2 of the semiconductor substrate 201. The diffraction grating 210 diffracts a part of the guided light to leak it to the outside of the semiconductor substrate 201, thereby attenuating the guided light.

Figure 12A:
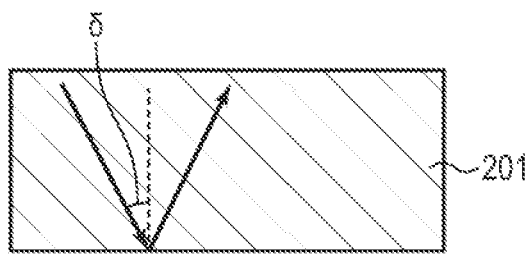
FIG. 12A and FIG. 12B are sectional schematic views illustrating the reflection of light in the diffraction grating according to the third embodiment.
Figure 12B:
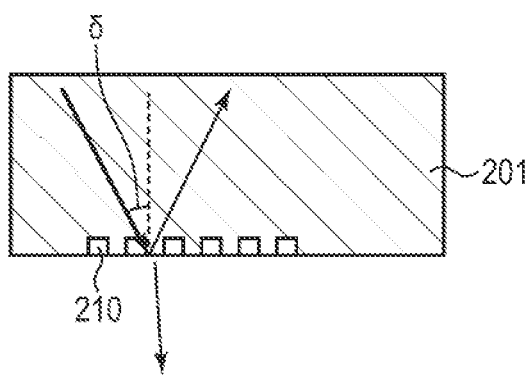

The mechanism by which the diffraction grating 210 diffracts a part of the guided light and leaks it to the outside of the semiconductor substrate 201 will be described with reference to FIG. 12A and FIG. 12B. FIG. 12A and FIG. 12B are diagrams for explaining reflection of light in the diffraction grating 210 according to the present embodiment.

FIG. 12A illustrates the reflection at the interface of the semiconductor substrate 201 when the diffraction grating 210 is not provided. When light is incident on the interface from the inside of the semiconductor substrate 201, if the incident angle δ satisfies the total reflection condition, as illustrated in FIG. 12A, total reflection occurs at the interface, and the light is confined in the semiconductor substrate 201.

FIG. 12B illustrates the reflection at the interface of the semiconductor substrate 201 when the diffraction grating 210 is provided. At this time, when light is incident on the diffraction grating 210 from the inside of the semiconductor substrate 201, the propagation angle of a part of the light is changed by diffraction and the total reflection condition is not satisfied. Therefore, as illustrated in FIG. 12B, a part of the guided light leaks to the outside of the semiconductor substrate 201. The technique of taking out the guided light by using the diffraction grating in this way is called a grating coupler.

The diffraction grating 210 has periodically modulated refractive index. The material of the diffraction grating 210 may be a dielectric material, a semiconductor material, or a metal material. The diffraction grating 210 is arranged at a position where the guided light is made incident on the diffraction grating 210.

The diffraction grating 210 may be formed, for example, directly on the surface of the semiconductor substrate 201 which is a waveguide. As an example of a method of directly forming the diffraction grating 210 on the surface of the semiconductor substrate 201, a method of periodically forming trenches of silicon oxide on the surface of the semiconductor substrate 201 can be mentioned. The trenches can be formed by a process similar to that of shallow trench isolation (STI) generally used in semiconductor devices.

The diffraction grating 210 may be formed in the vicinity of the semiconductor substrate 201 without directly forming the diffraction grating 210 on the semiconductor substrate 201. In this case, the diffraction grating 210 is provided near the semiconductor substrate 201 to the extent that the light is exuded as an evanescent wave. As an example of a method of forming the diffraction grating 210 in the vicinity of the semiconductor substrate 201, a method of forming the polysilicon diffraction grating 210 on the surface of the semiconductor substrate 201 with silicon oxide interposed therebetween can be mentioned. If the thickness of the silicon oxide is sufficiently thin, the evanescent wave is exuded to the polysilicon diffraction grating 210, and diffraction of light is occurred. The polysilicon diffraction grating 210 can be formed by the same process as a polysilicon gate generally used in semiconductor devices.

As another example of the method of forming the diffraction grating 210 in the vicinity of the semiconductor substrate 201, the diffraction grating 210 formed of a metal layer (for example, tungsten) is arranged in the vicinity of the semiconductor substrate 201. Since the diffraction grating 210 formed of the metal layer has both the effect of leaking the guided light by diffraction and the effect of absorbing the guided light, the propagation loss of the semiconductor substrate 201 can be made larger. As described in the first embodiment, since tungsten is suitable as a material of the light absorbing member 208, it is also suitable as a material of the metal layer for the diffraction grating 210.

The diffraction grating 210 is not arranged in the effective pixel area 101 and the optical black pixel area 102. This is because, in the effective pixel area 101 and the optical black pixel area 102, circuits constituting the pixel 10 or the like are arranged. The diffraction grating 210 may or may not be arranged in the outer peripheral area 104.

Figure 13:
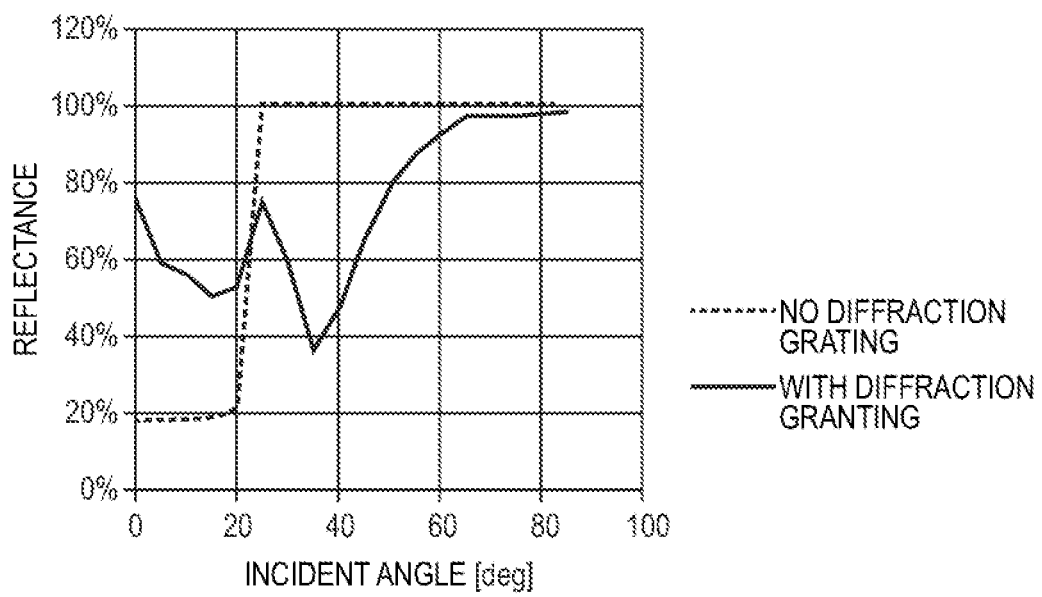
FIG. 13 is a graph showing the reflectance of light in the diffraction grating according to the third embodiment.

FIG. 13 is a graph showing the reflectance of light in the diffraction grating 210 according to the present embodiment. The vertical axis of FIG. 13 indicates reflectance, and the horizontal axis of FIG. 13 indicates the incident angle indicated by δ in FIG. 12A. The solid line in FIG. 13 shows the calculation result of the reflectance when light having a wavelength of 1000 nm enters the diffraction grating 210 from the semiconductor substrate 201 side, and the broken line in FIG. 13 shows the calculation result of the comparative example when the diffraction grating 210 is not present. The material of the semiconductor substrate 201 is silicon, and the diffraction grating 210 is a trench formed by silicon oxide on the surface of silicon. The depth of the trench is 200 nm, the width of the trench is 300 nm, and the pitch of the trench is 600 nm.

In the case where the diffraction grating 210 is not provided, light incident at an angle of not less than a critical angle (23.9° at the interface between silicon and silicon oxide) at which total reflection occurs is reflected by 100%. Therefore, light having an angle equal to or greater than the critical angle is guided in the semiconductor substrate 201 by repeating total reflection. On the other hand, in the case where the diffraction grating 210 is provided, the reflectance is not 100% even if the light is at or above the critical angle, and the light leaks to the outside of the semiconductor substrate 201. This is because, as described above, the propagation angle of a part of the light is changed by diffraction to be equal to or less than the critical angle, thereby generating a component which is not totally reflected.

Figure 14:
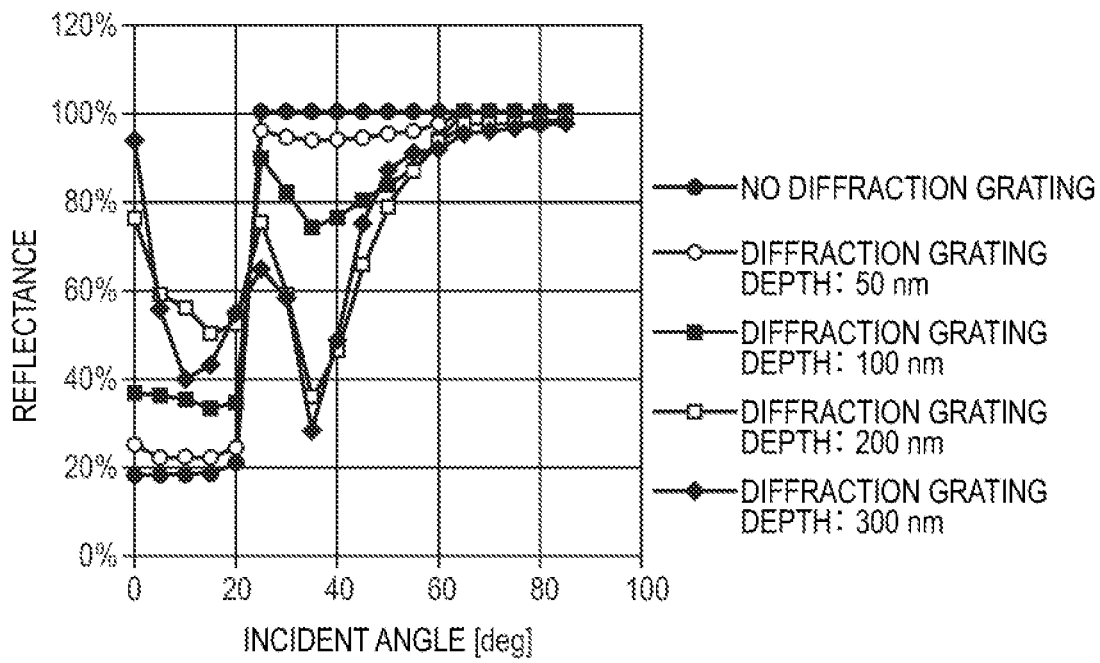
FIG. 14 is a graph showing the relationship between the reflectance of light in the diffraction grating and the depth of the diffraction grating according to the third embodiment.

The reflectance shown in FIG. 13 is an example, and the reflectance is also influenced by the depth, pitch, or the like of the diffraction grating 210. FIG. 14 is a graph showing the relationship between the reflectance of light in the diffraction grating 210 and the depth of the diffraction grating 210 according to the present embodiment. FIG. 14 shows the calculation result of the reflectance when the depth of the trench is changed in the range of 0 to 300 nm. The wavelength of the light is 1000 nm, the width of the trench of the diffraction grating 210 is 300 nm, and the pitch of the trench is 600 nm.

Comparing the calculation results for the trench depth in the range of 0 to 200 nm, it is found that the deeper the trench depth, the greater the effect of reducing the reflectance above the critical angle. However, comparing the case where the depth of the trench is 200 nm with the case where the depth of the trench is 300 nm, it is found that the effect of reducing the reflectance is substantially the same. From this result, it can be said that the effect of light leakage is improved as the depth of the trench is deeper up to the range of a critical value (in the present example, about 200 nm) of the trench of the diffraction grating 210, but when the critical value is exceeded, the effect of light leakage is saturated even if the trench is further deepened. Therefore, in order to sufficiently obtain the effect of reducing the reflectance, the depth of the trench is desirably 200 nm or more.

Figure 15:
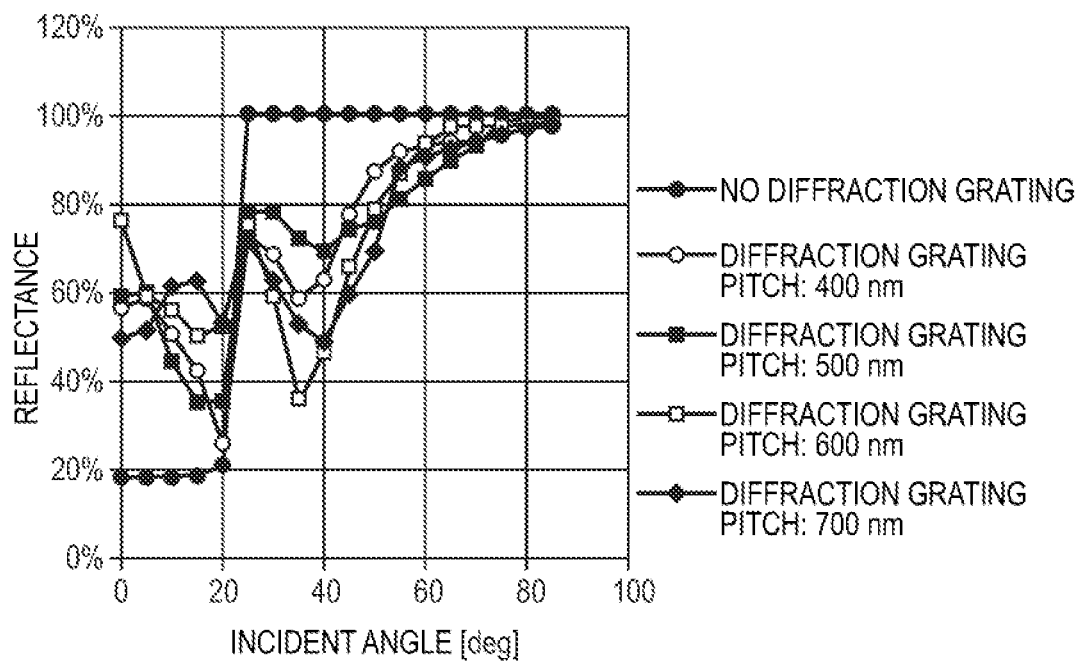
FIG. 15 is a graph showing the relationship between the reflectance of light in the diffraction grating and the pitch of the diffraction grating according to the third embodiment.

FIG. 15 is a graph showing the relationship between the reflectance of light in the diffraction grating 210 and the pitch of the diffraction grating 210 according to the present embodiment. FIG. 15 shows the calculation result of the reflectance when the pitch of the trenches is changed in the range of 400 to 700 nm. The wavelength of the light is 1000 nm, the width of the trench of the diffraction grating 210 is half the pitch, and the depth of the trench is 200 nm.

As can be understood from the calculation result of FIG. 15, the effect of reducing the reflectance varies by changing the pitch. Although the optimal pitch can vary depending on the refractive index, wavelength, or the like, the result shows that the effect of reducing the reflectance is highest in the case where the pitch is 600 nm under the above calculation conditions.

Figure 16:
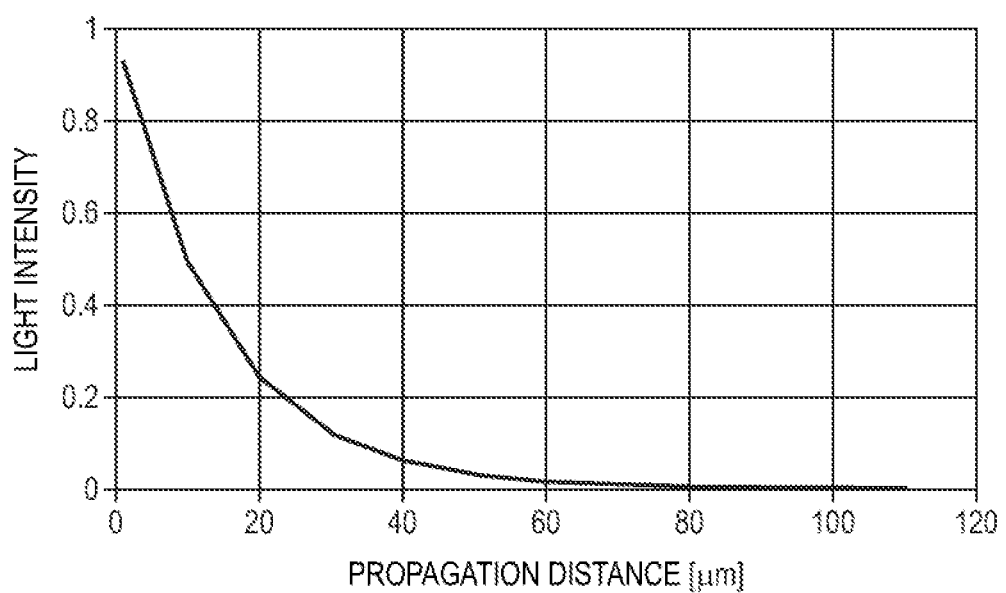
FIG. 16 is a graph showing the relationship between the intensity and the propagation distance of the guided light according to the third embodiment.

FIG. 16 is a graph showing the relationship between the intensity of the guided light and the propagation distance. The vertical axis of the graph in FIG. 16 indicates the intensity of the guided light, and the horizontal axis indicates the propagation distance. In the calculation of FIG. 16, the diffraction grating 210 is arranged on the first face F1 of the semiconductor substrate 201 (silicon) by a trench made of silicon oxide. The wavelength of the light is 1000 nm, the incident angle is 45°, the depth of the trench is 200 nm, the width of the trench is 300 nm, and the pitch of the trench is 600 nm. In this configuration, about 34% of the light is leaked to the outside of the semiconductor substrate 201 every time the light is reflected by the diffraction grating 210 once. In this calculation, light absorption by the silicon constituting the semiconductor substrate 201 is ignored, and only the effect by the diffraction grating 210 is taken into account.

As can be understood from the calculation result of FIG. 16, the guided light attenuates in accordance with the propagation distance. The required propagation distance, that is, the length L at which the diffraction grating 210 is provided, is determined according to how much the guided light needs to be attenuated.

The length of the diffraction grating 210 is preferably 35 μm or more, in which case the intensity of the guided light can be reduced to 1/10.

The length of the diffraction grating 210 is preferably 70 μm or more, and in this case, the intensity of the guided light can be reduced to 1/100.

The length of the diffraction grating 210 is preferably 105 μm or more, and in this case, the intensity of the guided light can be reduced to 1/1000.

Fourth Embodiment

Figure 17:
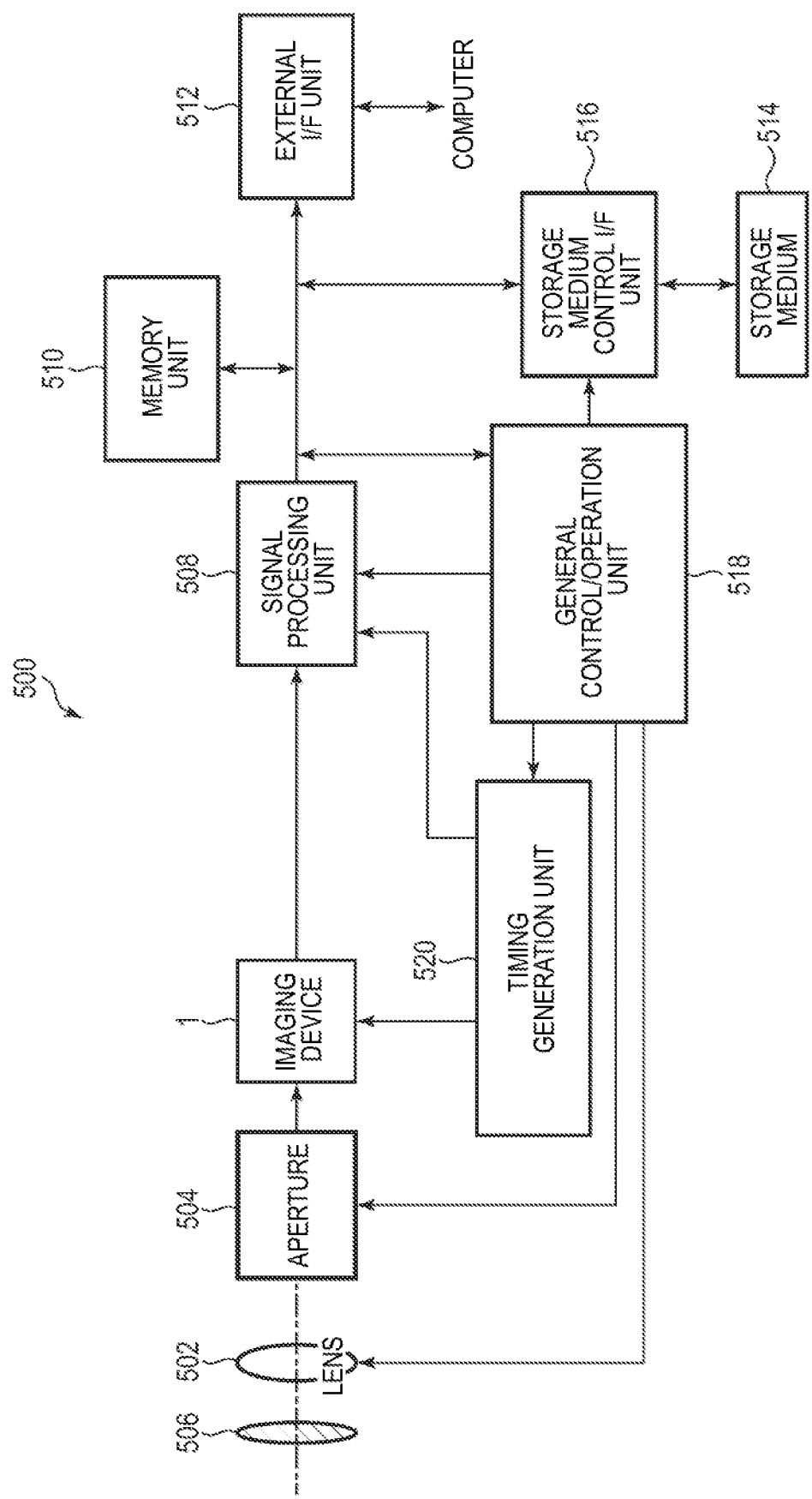
FIG. 17 is a block diagram illustrating a configuration example of an imaging system according to a fourth embodiment.

An imaging system according to a fourth embodiment of the present invention will be described with reference to FIG. 17. FIG. 17 is a block diagram illustrating a schematic configuration of an imaging system according to the present embodiment. The imaging device 1 illustrated in FIG. 17 is the photoelectric conversion device described in the above-described first to third embodiments. That is, the imaging system 500 according to the present embodiment is an example of a photoelectric conversion system to which the photoelectric conversion device described in the above-described first to third embodiments may be applied.

The imaging system 500 according to the present embodiment is not limited to but, can be applied to digital still cameras, digital camcorders, camera heads, copiers, fax machines, mobile phones, in-vehicle cameras, observation satellites or the like.

The imaging system 500 illustrated in FIG. 17 includes an imaging device 1, a lens 502, an aperture 504, a barrier 506, a signal processing unit 508, a timing generation unit 520, a general control/operation unit 518. Further, the imaging system 500 includes a memory unit 510, storage medium control I/F unit 516, and an external I/F unit 512.

The lens 502 captures an optical image of an object onto a pixel array 20 of the imaging device 1. The aperture 504 changes a light amount passing through the lens 502. The barrier 506 protects the lens 502. The imaging device 1 is configured as photoelectric conversion device in the above-described embodiment, and outputs a signal based on the optical image captured by the lens 502 to the signal processing unit 508.

The signal processing unit 508 performs desired processes, correction, data compression, or the like on the signal output from the imaging device 1. The signal processing unit 508 may be mounted on the same substrate as the imaging device 1, or may be mounted on another substrate. Further, a part of the function of the signal processing unit 508 may be mounted on the same substrate as the imaging device 1, and another part of the function of the signal processing unit 508 may be mounted on another substrate. The imaging device 1 may output not a digital signal but an analog signal before AD conversion. In this case, the signal processing unit 508 may further include an AD converter.

The timing generation unit 520 outputs various timing signals to the imaging device 1 and the signal processing unit 508. The general control/operation unit 518 is a control unit that controls driving and arithmetic processes of the entire imaging system 500. Herein, the timing signal or the like may be input from the outside of the imaging system 500, and the imaging system 500 may include at least the imaging device 1 and the signal processing unit 508 for processing the imaging signal output from the imaging device 1.

The memory unit 510 is a frame memory unit for temporarily storing image data. The storage medium control I/F unit 516 is an interface unit for recording or reading image data on or from the storage medium 514. The external I/F unit 512 is an interface unit for communicating with an external computer or the like. The storage medium 514 is a removable storage medium such as a semiconductor memory for recording or reading image data.

Thus, by configuring the imaging system 500 to which the photoelectric conversion device according to the first to third embodiments are applied, a high-performance imaging system 500 capable of acquiring a high-quality image can be realized.

Fifth Embodiment

Figure 18A:
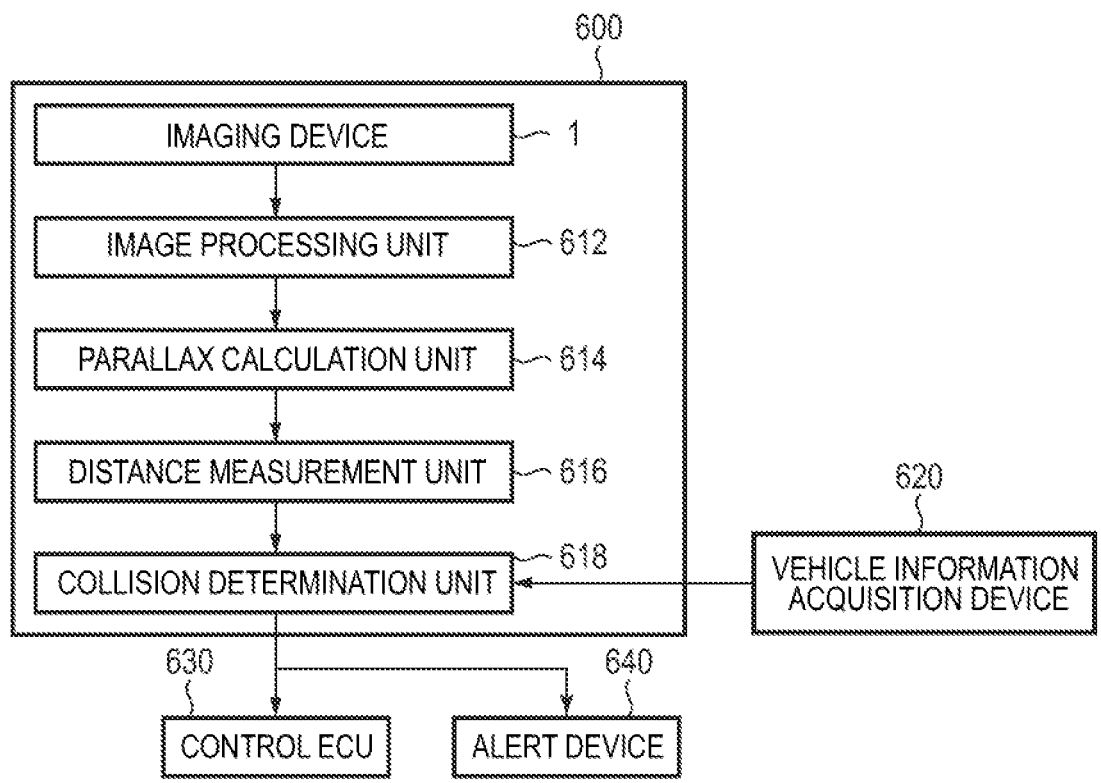
FIG. 18A and FIG. 18B are diagrams illustrating a configuration example of an imaging system and a moving body according to a fifth embodiment.
Figure 18B:
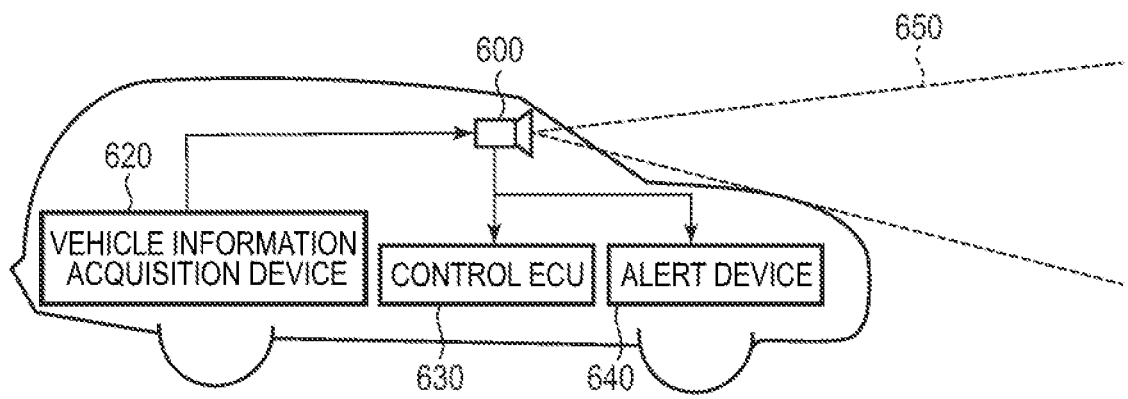

FIG. 18A and FIG. 18B are diagrams illustrating a configuration of an imaging system 600 and a moving body according to the present embodiment. FIG. 18A illustrates an example of an imaging system 600 related to an in-vehicle camera. An imaging system 600 has an imaging device 1 according to any one of the above-described the first to third embodiments. The imaging system 600 has an image processing unit 612 that performs image processing on a plurality of image data acquired by the imaging device 1 and a parallax calculation unit 614 that calculates a parallax (a phase difference of parallax images) from the plurality of image data acquired by the imaging system 600. Further, the imaging system 600 has a distance measurement unit 616 that calculates a distance to the object based on the calculated parallax and a collision determination unit 618 that determines whether or not there is a collision possibility based on the calculated distance. Herein, the parallax calculation unit 614 and the distance measurement unit 616 are an example of a distance information acquisition unit that acquires distance information on the distance to the object. That is, the distance information is information on a parallax, a defocus amount, a distance to an object, or the like. The collision determination unit 618 may use any of the distance information to determine the collision possibility. The distance information acquisition unit may be implemented by dedicatedly designed hardware or may be implemented by a software module. Further, the distance information acquisition unit may be implemented by a field programmable gate array (FPGA), an application specific integrated circuit (ASIC), or the like or may be implemented by a combination thereof.

The imaging system 600 is connected to the vehicle information acquisition device 620 and can acquire vehicle information such as a vehicle speed, a yaw rate, a steering angle, or the like. Further, the imaging system 600 is connected to a control ECU 630, which is a control device that outputs a control signal for causing a vehicle to generate braking force based on a determination result by the collision determination unit 618. That is, the control ECU 630 is an example of the distance information acquisition unit. Further, the imaging system 600 is also connected to an alert device 640 that issues an alert to the driver based on a determination result by the collision determination unit 618. For example, when the collision probability is high as the determination result of the collision determination unit 618, the control ECU 630 performs vehicle control to avoid a collision or reduce damage by applying a brake, pushing back an accelerator, suppressing engine power, or the like. The alert device 640 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 600. FIG. 18B illustrates the configuration of the imaging system 600 when a front area of a vehicle (a capturing area 650) is captured. The vehicle information acquisition device 620 sends an instruction to operate the imaging system 600 to perform imaging.

Thus, by configuring the imaging system 600 and the moving body to which the imaging device according to the first to third embodiments are applied, a high-performance imaging system 600 capable of acquiring high-quality images and a moving body capable of performing control with high accuracy can be realized.

Although the example of control for avoiding a collision to another vehicle has been described above, the embodiment is applicable to automatic driving control for following another vehicle, automatic driving control for not going out of a traffic lane, or the like. Furthermore, the imaging system is not limited to a vehicle such as the subject vehicle and can be applied to a moving body (moving apparatus) such as a ship, an airplane, an industrial robot, for example. In addition, the imaging system can be widely applied to a device which utilizes object recognition such as an intelligent transportation system (ITS) or the like, without being limited to moving bodies.

Modified Embodiment

The present disclosure is not limited to the above-described embodiment, and various modifications can be applied.

In the first and second embodiments, a light absorbing member 208 is provided in the dummy pixel areas 103*a* and 103*b*, and in the third embodiment, a diffraction grating 210 is provided in the dummy pixel areas 103*a* and 103*b*. The light absorbing member 208 and the diffraction grating 210 are examples of attenuating materials applicable to the present invention. However, the attenuating materials applicable to the present invention are not limited thereto. That is, the structure of the attenuating material is not limited to the light absorbing member 208 or the diffraction grating 210 described in the first to third embodiments, provided that the guided light propagating to the optical black pixel area 102 can be attenuated.

In the first embodiment, the light absorbing member 208 is arranged on the second face F2 of the semiconductor substrate 201, and in the second embodiment, the light absorbing member 208 is arranged on the first face F1 of the semiconductor substrate 201, but these may be combined. That is, the light absorbing member 208 may be arranged on both surfaces of the first face F1 and the second face F2 of the semiconductor substrate 201. In this case, since the guided light is absorbed on both sides of the semiconductor substrate 201, the intensity of the guided light incident on the optical black pixel area 102 can be further reduced.

The light absorbing member 208 of the first and second embodiments and the diffraction grating 210 of the third embodiment may be combined. For example, the light absorbing member 208 may be arranged on the first face F1, and the diffraction grating 210 may be arranged on the second face F2. In this case, as compared with the case where only one of the light absorbing member 208 and the diffraction grating 210 is provided, the intensity of the guided light incident on the optical black pixel area 102 can be further reduced.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions. For example, it should be understood that examples in which a part of the configuration of one embodiment is added to another embodiment, or examples in which a part of the configuration of another embodiment is replaced are also embodiments of the present invention.

This application claims the benefit of Japanese Patent Application No. 2020-097704, filed Jun. 4, 2020, which is hereby incorporated by reference herein in its entirety.

What is claimed is:

1. A photoelectric conversion device comprising:
a semiconductor substrate that has a first face and a second face;
a plurality of pixels that are arranged in a plurality of rows and a plurality of columns on the semiconductor substrate;
a light shielding layer that is arranged so as to cover a part of the first face of the semiconductor substrate; and
a wiring layer that is arranged on a side of the second face with respect to the semiconductor substrate,
wherein the plurality of pixels includes a first pixel that outputs a pixel signal based on an incident light from a side of the first face and a second pixel that outputs a reference signal of a black level,
wherein the semiconductor substrate has a first area that is not light-shielded by the light shielding layer, a second area that is light-shielded by the light shielding layer and in which the second pixel is arranged, and a third area that is arranged between the first area and the second area in a plan view,
wherein an attenuating member that attenuates a guided light entering the first area and propagating to the second area with the semiconductor substrate as a waveguide is arranged in the third area, and
wherein the first area is arranged closer to an outer periphery of the semiconductor substrate than the second area in the plan view.

2. The photoelectric conversion device according to claim 1, wherein the first pixel is not arranged in any of the first area, the second area, and the third area.

3. The photoelectric conversion device according to claim 1, wherein a length of the attenuating member is longer than that of one pixel among the plurality of pixels in a direction parallel to the first face and the second face of the semiconductor substrate.

4. The photoelectric conversion device according to claim 1, wherein a material of the semiconductor substrate contains silicon as a primary component.

5. The photoelectric conversion device according to claim 1, wherein the attenuating member is a light absorbing member that absorbs the guided light.

6. The photoelectric conversion device according to claim 5, wherein a material of the light absorbing member contains tungsten as a primary component.

7. The photoelectric conversion device according to claim 5, wherein the light absorbing member is arranged on the side of the second face with respect to the semiconductor substrate.

8. The photoelectric conversion device according to claim 5, wherein the light absorbing member is arranged between the second face and the wiring layer.

9. The photoelectric conversion device according to claim 5, wherein the light absorbing member is arranged on the side of the first face with respect to the semiconductor substrate.

10. The photoelectric conversion device according to claim 5, wherein the light absorbing member is arranged between the first face and the light-shielding layer.

11. The photoelectric conversion device according to claim 9, wherein a material of the light absorbing member is different from a material of the light-shielding layer.

12. The photoelectric conversion device according to claim 5, wherein a distance between the light absorbing member and the semiconductor substrate is equal to or less than 100 nanometers.

13. The photoelectric conversion device according to claim 5, wherein a distance between the light absorbing member and the semiconductor substrate is equal to or less than 80 nanometers.

14. The photoelectric conversion device according to claim 5, wherein a distance between the light absorbing member and the semiconductor substrate is equal to or less than 70 nanometers.

15. The photoelectric conversion device according to claim 5, wherein a distance between the light absorbing member and the semiconductor substrate is equal to or less than 50 nanometers.

16. The photoelectric conversion device according to claim 5, wherein a distance between the light absorbing member and the semiconductor substrate is equal to or less than 40 nanometers.

17. The photoelectric conversion device according to claim 5, wherein a distance between the light absorbing member and the semiconductor substrate is equal to or less than 20 nanometers.

18. The photoelectric conversion device according to claim 5, wherein a distance between the light absorbing member and the semiconductor substrate is equal to or less than 10 nanometers.

19. The photoelectric conversion device according to claim 5, wherein a length of the light absorbing member is equal to or greater than 15 micrometers in a direction parallel to the first face and the second face of the semiconductor substrate.

20. The photoelectric conversion device according to claim 5, wherein a length of the light absorbing member is equal to or greater than 30 micrometers in a direction parallel to the first face and the second face of the semiconductor substrate.

21. The photoelectric conversion device according to claim 5, wherein a length of the light absorbing member is equal to or greater than 45 micrometers in a direction parallel to the first face and the second face of the semiconductor substrate.

22. The photoelectric conversion device according to claim 1, wherein the attenuating member is a diffraction grating that diffracts the guided light outside the semiconductor substrate.

23. The photoelectric conversion device according to claim 22, wherein the diffraction grating is constituted by trenches arranged at a predetermined pitch on the first face or the second face of the semiconductor substrate.

24. The photoelectric conversion device according to claim 23, wherein a depth of the trenches is equal to or greater than 200 nanometers.

25. The photoelectric conversion device according to claim 22, wherein the diffraction grating is constituted by a polysilicon arranged at a predetermined pitch on the first face or the second face of the semiconductor substrate.

26. The photoelectric conversion device according to claim 22, wherein the diffraction grating is constituted by a metal layer arranged at a predetermined pitch on the first face or the second face of the semiconductor substrate.

27. The photoelectric conversion device according to claim 26, wherein a material of the metal layer contains tungsten.

28. The photoelectric conversion device according to claim 22, wherein a length of the diffraction grating is equal to or greater than 35 micrometers in a direction parallel to the first face and the second face of the semiconductor substrate.

29. The photoelectric conversion device according to claim 22, wherein a length of the diffraction grating is equal to or greater than 70 micrometers in a direction parallel to the first face and the second face of the semiconductor substrate.

30. The photoelectric conversion device according to claim 22, wherein a length of the diffraction grating is equal to or greater than 105 micrometers in a direction parallel to the first face and the second face of the semiconductor substrate.

31. The photoelectric conversion device according to claim 1,
wherein the plurality of pixels further includes a third pixel that does not output any of the pixel signal and the reference signal, and
wherein the third pixel is arranged in the third area.

32. A photoelectric conversion system comprising:
the photoelectric conversion device according to claim 1; and
a signal processing unit configured to process a signal output from the photoelectric conversion device.

33. A moving body comprising:
the photoelectric conversion device according to claim 1;
a distance information acquisition unit configured to acquire distance information on a distance to an object, from a parallax image based on signals from the photoelectric conversion device; and
a control unit configured to control the moving body based on the distance information.

34. The photoelectric conversion device according to claim 1, wherein, in a plan view with respect to the second surface, the attenuating member extends over the plurality of pixels.

* * * * *